United States Patent
Onishi et al.

(10) Patent No.: US 6,225,798 B1
(45) Date of Patent: May 1, 2001

(54) SEMICONDUCTOR DEVICE TESTER

(75) Inventors: Takeshi Onishi, Gyoda; Katuhiko Suzuki, Ohra-gun, both of (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/202,467
(22) PCT Filed: Apr. 16, 1998
(86) PCT No.: PCT/JP98/01750
§ 371 Date: Dec. 15, 1998
§ 102(e) Date: Dec. 15, 1998
(87) PCT Pub. No.: WO98/47011
PCT Pub. Date: Oct. 22, 1998

(30) Foreign Application Priority Data

Apr. 16, 1997 (JP) .................................... 9-099095

(51) Int. Cl.$^7$ .................................................. G01R 31/28
(52) U.S. Cl. ....................... 324/158.1; 324/760; 209/537
(58) Field of Search ............................. 324/158.1, 760, 324/765; 209/655, 573

(56) References Cited

U.S. PATENT DOCUMENTS

| | | | |
|---|---|---|---|
| 4,423,815 | * 1/1984 | Boissicat | 209/655 |
| 4,694,964 | 9/1987 | Ueberreiter | 209/549 |
| 5,227,717 | * 7/1993 | Tsurishima et al. | 324/158.1 |
| 5,307,011 | 4/1994 | Tani | 324/158 |
| 5,313,156 | 5/1994 | Klug et al. | 324/158 |
| 5,319,353 | 6/1994 | Ohnishi et al. | 340/525 |
| 5,473,259 | * 12/1995 | Takeda | 324/760 |
| 5,625,287 | 4/1997 | Nakamura et al. | 324/158.1 |

FOREIGN PATENT DOCUMENTS

| | | | |
|---|---|---|---|
| 3340183 | 5/1985 | (DE) | . |
| 4126920 | 3/1992 | (DE) | . |
| 19512144 | 1/1996 | (DE) | . |
| 1178877 | 7/1989 | (JP) | . |
| 2147973 | 6/1990 | (JP) | . |
| 34181 | 1/1991 | (JP) | . |
| WO9705495 | * 2/1997 | (JP) | G01R/31/26 |

* cited by examiner

Primary Examiner—Safet Metjahic
Assistant Examiner—Jimmy Nguyen
(74) Attorney, Agent, or Firm—Gallagher & Lathrop; David N. Lathrop

(57) ABSTRACT

In an IC tester comprising a tester part and a handler which includes two test stations or an IC tester comprising a tester part and two handlers, useless waiting times wasted by the tester part are eliminated. Means (S0) is provided for inputting a simultaneous measurement mode into the handler 2, and when the simultaneous measurement mode is inputted, the handler waits, in case the test preparation in the first test station 15a is completed and the test preparation in the second test station 15b is not completed, till the test preparation in the second station is completed, and when the test preparation in the second station is completed, the handler transmits the test preparation complete signals of both the stations to the tester part 1. The handler waits, in case the test preparation in the second station is completed and the test preparation in the first station is not completed, till the test preparation in the first station is completed, and when the test preparation in the first station is completed, the handler transmits the test preparation complete signals of both the stations to the tester part.

8 Claims, 8 Drawing Sheets

SEMICONDUCTOR DEVICE TESTER

TECHNICAL FIELD

The present invention relates to a semiconductor device testing apparatus (commonly called tester) for testing various types of semiconductor devices including semiconductor device integrated circuits (hereinafter each referred to as IC), and more particularly, to a semiconductor device testing apparatus of the type having a semiconductor device transporting and handling (processing) apparatus (commonly called handler) connected to the testing apparatus, for transporting various types of semiconductor devices to be tested (semiconductor devices under test, each commonly called DUT) to a testing or test station for testing them, and carrying the tested semiconductor devices out of the testing station for transport to a desired location.

BACKGROUND ART

Many of semiconductor device testing apparatuses for measuring the electrical characteristics of semiconductor devices to be tested, i.e. devices under test, by applying a test signal of a predetermined pattern to the devices have a semiconductor device transporting and handling (processing) apparatus (hereinafter referred to as handler) connected thereto for transporting semiconductor devices to a testing or test station where they are brought into electrical contact with sockets of the test head of the testing apparatus, followed by carrying the tested semiconductor devices out of the testing station and sorting them out into conforming (pass) and non-conforming (failure or defective) articles on the basis of the data of the test results.

In the following disclosure the electric or electronic part of the semiconductor device testing apparatus which measures the electrical characteristics of semiconductor devices under test by applying a test signal of a predetermined pattern to the devices is referred to as tester part, and a testing apparatus comprising the tester part and a handler or handlers connected to the tester part is referred to as semiconductor device testing apparatus (as will be referred to as tester hereinafter).

Generally, there are many cases that a tester comprising one tester part and two handlers connected to the tester part is operated as one tester. In such cases, the tester is arranged such that the two handlers are synchronously operated so that semiconductor devices in the two handlers can be tested at the same time. Also, there is often used a tester comprising one tester part and one handler which has two test stations provided therein and the two test stations are synchronously operated so that semiconductor devices in the two test stations can be tested at the same time.

In the following disclosure, for clarity of explanation, the present invention will be described by taking ICs typical of semiconductor devices as an example thereof.

First, one example of the testers of the type to which the present invention is intended to be applied will be described with reference to FIGS. 5 to 7.

FIG. 5 is a block diagram showing the general construction of an example of the IC tester comprising a tester part and a handler connected to the tester part in which the handler has two test stations provided therein which are synchronously operated so that ICs to be tested in the two test stations can be tested at the same time. This IC tester 100 comprises a tester part 1 including a tester proper 1a, a test or tester head 1b and an input part 1c, and a handler 2 connected to the tester part 1.

The tester proper 1a includes an input/output interface circuit (hereinafter referred to as I/O circuit) 3, and a central processing unit (hereinafter referred to as CPU) 4, a read-only memory (hereinafter referred to as ROM) 5 and a random access memory (hereinafter referred to as RAM) 6 all of which are connected to the I/O circuit 3. The test head 1b is separated from the tester proper 1a and is disposed at a first and a second test stations 15a and 15b of the handler 2. The first and second test stations 15a and 15b will be discussed later. The CPU 4 reads out a system program stored in the ROM 5 therefrom to decode and process it, thereby to control the operations of the tester part 1 and the handler 2.

The handler 2 comprises a loader section 16 where ICs to be tested which a user has beforehand loaded on universal trays or customer trays (hereinafter referred to as universal tray) are transferred and reloaded onto a test tray 14 capable of withstanding high/low temperatures, a chamber section for testing ICs under test 13 such as semiconductor memories which have been brought therein as loaded on a test tray 14, and an unloader section 17 where the tested ICs which have been carried on the test tray 14 out of the chamber section subsequently to undergoing a test therein are transferred from the test tray 14 to the universal trays to be reloaded on the latter. The unloader section 17 is generally configured to sort out tested ICs based on the data of the test results and load them on the corresponding universal trays.

The chamber section comprises a constant temperature or thermostatic chamber (soak chamber) 12a for imposing temperature stresses of either a designed high or low temperature on ICs under test 13 loaded on a test tray 14, a first and a second test chambers 12b and 12c for conducting a primary (first) measure and a secondary (second) measure on the ICs under the temperature stress imposed in the constant temperature chamber 12a respectively, and a temperature stress removing chamber (exit chamber) 12d for removing the temperature stress imposed in the constant temperature chamber 12a from the ICs having undergone the measures in the test chambers. The test chambers 12b and 12c are disposed in the constant temperature chamber 12a and contain thereunder the test head 1b of the tester part 1, the two test stations 15a and 15b mounted on the test head 1b being disposed in the corresponding first and second test chambers 12b and 12c. The test stations 15a and 1b serve to apply various testing electrical signals to the ICs electrically contacted with the IC sockets thereof through the test head 1b, respectively, and to receive response signals from the ICs and transmit same to the tester part 1.

The test tray 14 is moved in a circulating manner from and back to the loader section 16 sequentially through the constant temperature chamber 12a, the first test chamber 12b, the second test chamber 12c and the temperature stress removing chamber 12d of the chamber section, and the unloader section 17.

If ICs have had a high temperature applied thereto in the constant temperature chamber 12a, the temperature stress removing chamber 12d cools the ICs with forced air down to the room temperature prior to delivering them out to the unloader section 17. If ICs have had a low temperature of, say, about −30° C. applied thereto in the constant temperature chamber 12a, they are heated with heated air or a heater up to a temperature at which no condensation occurs prior to delivering them out to the unloader section 17.

A test tray 14, loaded with many ICs 13 to be tested in the loader section 16, is conveyed from the loader section 16 to the constant temperature chamber 12a of the chamber section which is equipped with a vertical transport means in the temperature stress giving section therein adapted to support a plurality of (say, ten) test trays 14 in the form of a stack. For example, a test tray newly received from the loader section 16 is supported on the top of the stack while the lowermost test tray is delivered out to the first test chamber 12b.

ICs 13 to be tested are loaded with either a predetermined high or low temperature stress as the associated test tray 14 is moved sequentially from the top to the bottom of the stack by the vertically downward movement of the vertical transport means and during a waiting period until the first test chamber 12b is emptied. In the first test chamber 12b and the second test chamber 12c there are disposed the first test station 15a and the second test station 15b, respectively. The test tray 14 which has been carried one by one out of the temperature giving section of the constant temperature chamber 12a is conveyed at first on the first test station 15a where a predetermined number of ICs out of the ICs under test loaded on the test tray are brought into electrical contact with IC sockets mounted to the first test station 15a to conduct the primary measure (test) on the ICs. Upon completion of the primary measure on all of the ICs placed on one test tray, the test tray 14 is conveyed on the second test station 15b where a predetermined number of ICs out of the ICs under test loaded on the test tray are brought into electrical contact with IC sockets mounted to the second test station 15b to conduct the secondary measure (test) on the ICs. Upon completion of the secondary measure on all of the ICs placed on one test tray, the test tray 14 is conveyed to the temperature stress removing temperature chamber 12d where the tested ICs are relieved of the temperature stress to be restored to the room temperature prior to being delivered to the unloader section 17.

Like the temperature stress giving section of the constant temperature chamber 12a as described above, the temperature stress removing chamber 12d is also equipped with a vertical transport means adapted to support a plurality of (say, ten) test trays 14 stacked one on another. For example, a test tray newly received from the second test station 15b is supported at the bottom of the stack while the uppermost test tray is discharged to the unloader section 17. The tested ICs are relieved of the temperature stress to be restored to the outside temperature (room temperature) as the associated test tray 14 is moved successively from the bottom to the top of the stack by the vertically upward movement of the vertical transport means.

The tested ICs as carried on the test tray 14 are passed to the unloader section 17 where they are sorted out by categories based on the data of the test results and transferred onto and stored in the corresponding universal trays. The test tray 14 emptied in the unloader section 17 is delivered back to the loader section 16 where it is again loaded with ICs to be tested from the universal tray to repeat the same steps of operation.

The handler 2 further includes an input part 7, an I/O circuit 8, a CPU 9, a ROM 10 and a RAM 11. The I/O circuit 8 is connected to the I/O circuit 3 of the tester part 1, and the CPU 9 reads out a system program stored in the ROM 10 under the control of the CPU 4 to decode and process, thereby to control various parts or elements in the handler 2. The CPU 9 cooperates with the tester part 1.

FIG. 6 shows the corresponding relationship between each of the measurement cycles M in the respective test stations 15a (TS1) and 15b (TS2) and a plurality of test trays #1, #2, . . . , #P in the case that ICs under test loaded on the test trays #1, #2, . . . , #P are measured (or tested) in the first test station (TS1) and the second test station (TS2) respectively. Only in the cases of the first cycle (M=1) and the last cycle (M=P+1), the measurement is carried out only in the first test station (TS1) and the second test station (TS2), respectively, and in other cycles simultaneous measurements (parallel measurements) are effected in both the test stations if there occurs no trouble.

FIG. 7 is a flow-chart for explaining the operation of the conventional IC tester described above with reference to FIG. 5. Now it will be explained in the sequence of steps.

Step S0: the maximum waiting time Tmax required for performing the simultaneous measurements in both the test stations (hereinafter referred to simply as the maximum waiting time Tmax for the simultaneous measurements) is written in the RAM 6 of the tester proper 1a from the input part 1c of the tester part 1.

Step S1: at first the measurement cycle M is set to 1 (M=1).

Step S2: a test tray 14 loaded with plural ICs 13 under test thereon is conveyed onto the first test station 15a (TS1) from the constant temperature chamber 12a.

Step S3: the CPU 9 of the handler 2 checks whether a test can be carried out or not in the first test station 15a, and if it can be carried out (YES), the program proceeds to the next step S4.

Step S4: in the handler 2 a Z-drive (elevator means for moving in the up-and-down direction) for moving the test tray in the up-and-down direction is actuated to move the test tray downwardly so that the ICs under test are brought into contact with IC sockets of the first test station 15a as the ICs remain loaded on the test tray.

Step S5: the CPU 4 of the tester part 1 checks whether the preparation of a test in the second test station 15b (TS2) can be completed (can be OK) or not, and if it can be completed (YES), the program proceeds to the next step S7, and if it cannot (NO), the program proceeds to a branched step S6.

Step S6: if the preparation of a test in the second test station 15b cannot be completed, the CPU 4 of the tester part 1 waits on till the preparation of a test in the second test station 15b (TS2) is completed within the limit of the maximum waiting time Tmax. That is, during that the waiting time T required for performing the simultaneous measurements (hereinafter referred to simply as the waiting time T for the simultaneous measurements) is equal to or shorter than Tmax (T≦Tmax), the program returns back to the previous step S5, and when the waiting time T for the simultaneous measurements is longer than Tmax (T>Tmax), the program proceeds to next step S7.

Step S7: a measurement is performed in the first test station 15a.

Step S8: after the measurement in step S7 is ended, the Z-drive is actuated to move the test tray in the first station 15a upwardly.

Step S9: the test tray is conveyed from the first test station 15a to the second test station 15b.

Step S10: the measurement cycle M is added by one (+1) and the program goes to the next measurement.

Steps S2' to S9': the similar operations carried out in the second test station 15b in case of M≧2 similar to the operations (steps S2 to S9) in the first test station 15a described above. When the operations of the steps S2' to S9' are effected, the operations of the steps S2 to S9 are also performed in the first test station in parallel therewith except the measurement cycle of P+1.

Step S11: if M≧2, the program proceeds to the next step S2', and if M<2, the program waits till M=2.

From the above discussion of the operation of the conventional IC tester, it can be understood that except the first measurement cycle of M=1 and the last measurement cycle of M=P+1, the simultaneous measurements (parallel measurements) are carried out in other cycles in both the test stations if there occurs no trouble.

Next, another example of the testers of the type to which the present invention is intended to be applied will be described with reference to FIG. 8.

FIG. 8 is a block diagram showing the general construction of an example of the IC tester comprising a tester part 1 and two handlers 2-1 and 2-2 each connected to the tester part 1 in which the two handlers 2-1 and 2-2 are synchronously operated so that ICs to be tested in the two handlers can be tested at the same time. Since the constructions of the tester part 1 of the IC tester 100 and each of the handlers 2-1, 2-2 may be the same as those of the tester part and the handler (but only one test station is provided therein) shown in FIG. 5, only a tester proper 1a and two test heads 1a1 and 1b2 are shown in the tester part 1a, only an I/O circuit 3 is shown in the tester proper 1a, and only an I/O circuit 8 and a test station 15 are shown in each of the handler.

In the IC tester 100 thus constructed, the two handlers 2-1, 2-2 have no way what to know the status of the operation of the other handler. For this reason, it is not always made possible that the measurements of ICs under test can be performed in the respective test heads 1a1 and 1b2 of the two handlers 2-1 and 2-2 at the same time. For example, if one of the handlers temporarily stops due to occurrence of some trouble, the measurement is done only by the other handler during this temporal stop of the one handler, and hence the simultaneous measurements of ICs cannot be carried out. Recently, the test time duration required for ICs under test tends to be long, and it is indispensable to an increase of production that the simultaneous measurements can be performed.

Heretofore, the synchronization of the two handlers 2-1 and 2-2 are taken by the tester part 1. Before the IC tester 100 is started, an operator inputs the maximum waiting time Tmax for the simultaneous measurements into the tester part 1 in consideration of the test time duration, the index time and the like. In general, the tester part 1 is arranged such that after received a test request signal from one handler, it waits a test request signal from the other handler within the limit of the maximum waiting time Tmax.

If such method is adopted, in such case as one handler can under no circumstances perform a test for a while, that is, in case that the tester part need not wait until the maximum waiting time Tmax for the simultaneous measurements elapses, it must always wait until the maximum waiting time Tmax for the simultaneous measurements elapses because any confirmation of the status of the handlers is not effected. In addition, notwithstanding that the simultaneous measurements are made possible if the tester part can wait for a little longer, there is often the case that the test has been started in the one handler.

As discussed above, in case of a conventional IC tester as shown in FIG. 5 which comprises a tester part and a handler connected to the tester part and having two test stations provided therein, if the maximum waiting time Tmax for the simultaneous measurements set to the tester part is too short, there is often the case that the simultaneous measurements are made possible if the tester part can wait for a little longer, which results in a drawback that the throughput of the IC tester is reduced.

Likewise, in case of a conventional IC tester as shown in FIG. 8 which comprises a tester part and two handlers each connected to the tester part, it has the same disadvantage as that described above, and further has a drawback that even if the tester part need not wait until the maximum waiting time Tmax for the simultaneous measurements elapses (for example, a case that the other handler is under an alarm status and a process for removing this alarm status is being conducted, and the like), it always has to wait until the maximum waiting time Tmax elapses.

DISCLOSURE OF THE INVENTION

It is an object of the present invention to provide a semiconductor device testing apparatus which can eliminate the drawbacks that occur in the conventional semiconductor device testing apparatus.

It is another object of the present invention to provide a semiconductor device testing apparatus in which the tester part has no need to wait a test preparation complete signal within the limit of the maximum waiting time by providing input means for inputting a simultaneous measurement mode in a handler having two test stations provided therein.

It is further object of the present invention to provide a semiconductor device testing apparatus in which the tester part has no need to wait a test preparation complete signal within the limit of the maximum waiting time by arranging two handlers such that they can confirm the status of the operation of the other handler.

In order to accomplish the above objects, in a first aspect of the present invention, there is provided a semiconductor device testing apparatus comprising one tester part and one handler, wherein the handler has a first test station provided therein which conducts a primary measurement on semiconductor devices under test and a second test station provided therein which conducts a secondary measurement on semiconductor devices under test, and wherein the tester part waits, in case that the preparation of a test in the one test station is completed, till the preparation of a test in the other test station is completed within the limit of the maximum waiting time (Tmax), and if the preparation of a test in the other test station is completed within the maximum waiting time, performs the simultaneous measurements in both the test stations, and if not completed, performs the measurement only in the one test station, the semiconductor device testing apparatus being arranged such that in case that the preparation of a test in the first test station is completed and the preparation of a test in the second test station is not completed, the measurement is started only in the first test station without waiting the completion of the preparation of a test in the second test station if there is no test tray in the second test station, and when there is a test tray in the second test station, the handler waits till the preparation of a test in the second test station is completed within the limit of the maximum waiting time (Tmax), and in case that the preparation of a test in the second test station is completed within the maximum waiting time, the simultaneous measurements are carried out in the first and the second test stations at the same time, and in case that the preparation of a test in the second test station is not completed, the measurement is started only in the first test station; and that in case that the preparation of a test in the second test station is completed and the preparation of a test in the first test station is not completed, the measurement is started only in the second test station without waiting the completion of the preparation of a test in the first test station if there is no test tray in a loader section or the first test station, and when there is a test tray in the loader section or the first test station, the handler waits till the preparation of a test in the first test station is completed within the limit of the maximum waiting time (Tmax), and in case that the preparation of a test in the first test station is completed within the maximum waiting time, the measurements are carried out in the first and the second test stations at the same time, and in case that the preparation of a test in the first test station is not completed, the measurement is started only in the second test station.

In a preferred embodiment, an input means for inputting a simultaneous measurement mode into the handler is provided in the handler, and when the simultaneous measurement mode is inputted into the handler from the input means, the handler waits, in case that the preparation of a test in the first test station is completed and the preparation of a test in the second test station is not completed, till the preparation of a test in the second test station is completed if there is a test tray in the second test station, and when the preparation of a test in the second test station is completed, the handler transmits the test preparation complete signals of the first and the second test stations to the tester part, and if there is no test tray in the second test station, the handler transmits only the test preparation complete signal of the first test station to the tester part without waiting till the preparation of a test in the second test station is completed, and the handler waits, in case that the preparation of a test in the second test station is completed and the preparation of a test in the first test station is not completed, till the preparation of a test in the first test station is completed if there is a test tray in the loader section or the first test station, and when the preparation of a test in the first test station is completed, the handler transmits the test preparation complete signals of the first and the second test stations to the tester part, and if there is no test tray in the loader section or the first test station, the handler transmits only the test preparation complete signal of the second test station to the tester part without waiting till the preparation of a test in the first test station is completed.

In a second aspect of the present invention, there is provided a semiconductor device testing apparatus comprising one tester part and two handlers, wherein the tester part waits, in case that the preparation of a test in the one handler is completed, till the preparation of a test in the other handler is completed within the limit of the maximum waiting time (Tmax), and if the preparation of a test in the other handler is completed within the maximum waiting time, performs the simultaneous measurements in both the handlers, and if not completed, performs the measurement only in the one handler, the semiconductor device testing apparatus being arranged such that in case that the preparation of a test in the one handler is completed and the preparation of a test in the other handler is not completed, the measurement is started only in the one handler without waiting the completion of the preparation of a test in the other handler if there is no test tray in a loader section or a test station of the other handler, and when there is a test tray in the loader section or the test station of the other handler, the one handler waits till the preparation of a test in the other handler is completed within the limit of the maximum waiting time (Tmax), and in case that the preparation of a test in the other handler is completed within the maximum waiting time, the measurements are carried out in both the handlers at the same time, and in case that the preparation of a test in the other handler is not completed, the measurement is started only in the one handler.

In a third aspect of the present invention, there is provided a semiconductor device testing apparatus comprising one tester part and two handlers, wherein the tester part waits, in case that the preparation of a test in the one handler is completed, till the preparation of a test in the other handler is completed within the limit of the maximum waiting time (Tmax), and if the preparation of a test in the other handler is completed within the maximum waiting time, performs the simultaneous measurements in both the handlers, and if not completed, performs the measurement only in the one handler, the semiconductor device testing apparatus being characterized in that: interface circuits by which the two handlers directly communicate with each other are provided in the handlers respectively, the interface circuits being connected with each other by communication cable means; one of the two handlers is set to a host handler and the other handler is set to a slave handler; an input means is provided for inputting a simultaneous measurement mode into at least one of the host handler and the tester part; and the host handler monitors, when the simultaneous measurement mode is inputted, the status of the slave handler through the interface circuits, and in case that the preparation of a test in the host handler is completed and the preparation of a test in the slave handler is not completed, test preparation complete signals (test start signals) are transmitted to the tester part from both the handlers substantially at the same time after the host handler waits till the preparation of a test in the slave handler is completed.

In a preferred embodiment, the upper limit time duration (HTmax) is provided for the time duration that the host handler waits till the preparation of a test in the slave handler is completed, and when the upper limit time duration has passed, the host handler transmits its test preparation complete signal to the tester part.

In addition, a mode which prevents the simultaneous measurements from being performed when an alarm occurs in one of the handlers is provided in the simultaneous measurement mode, and in case this mode is selected, when an alarm occurs in the one handler, the other handler transmits its test preparation complete signal to the tester part on completion of the preparation of a test in the other handler, and the tester part performs the measurement only in the other handler without waiting till the preparation of a test in the one handler is completed.

The slave handler transmits a signal representing its status of operation to the host handler at regular intervals. The signal representing the status of operation of the slave handler includes an alarm occurrence informing signal, a test preparation complete signal, a handler empty signal indicating that a semiconductor device under test is not supplied to a test station, and a signal under test preparation.

BEST MODE FOR CARRYING OUT THE INVENTION

The embodiments of the present invention will be described in details with reference to FIGS. 1 to 4.

Figure 1:
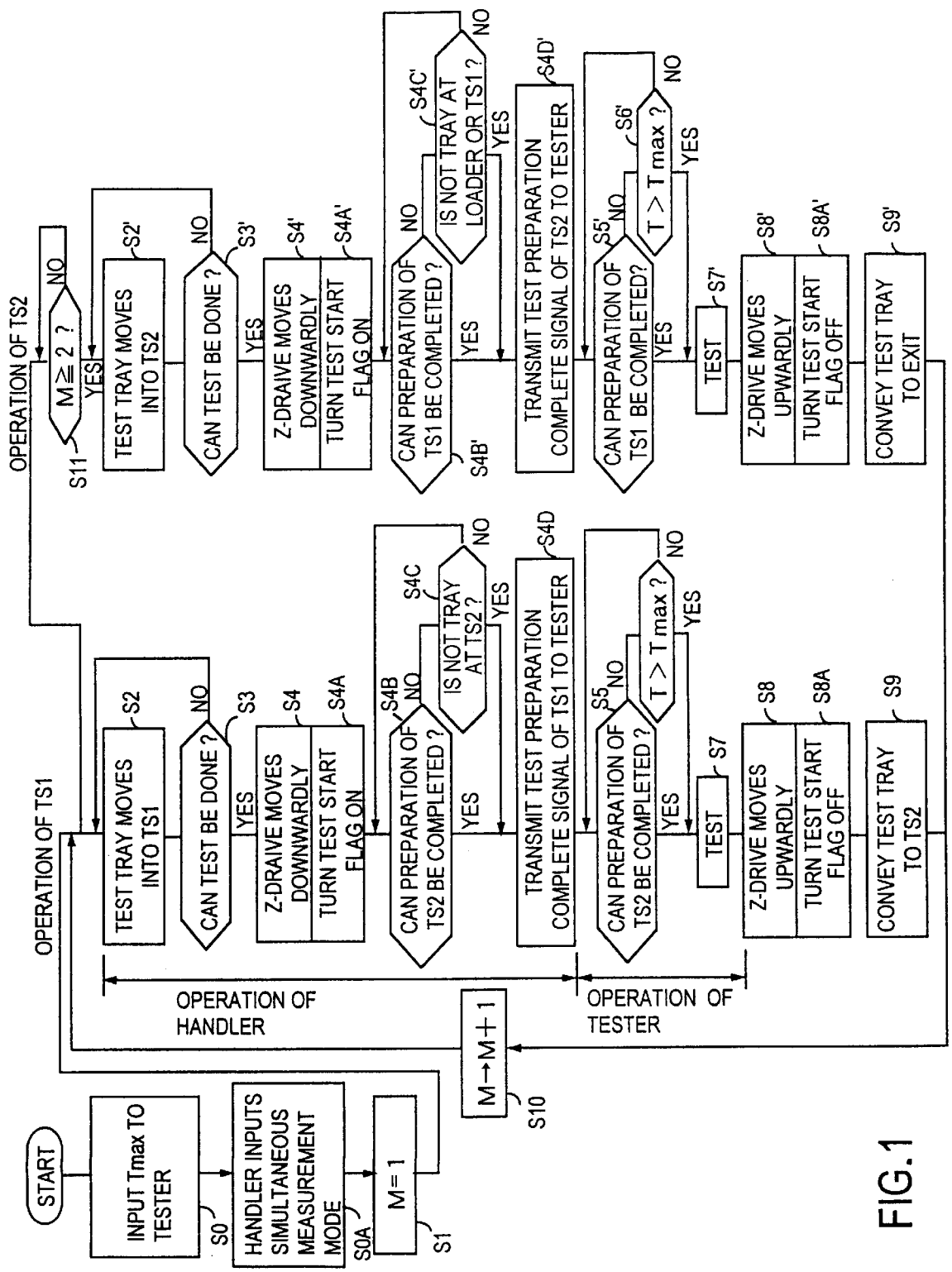
FIG. 1 is a flow chart for explaining the operation of an example of the IC tester to which the present invention is applied.
Figure 5:
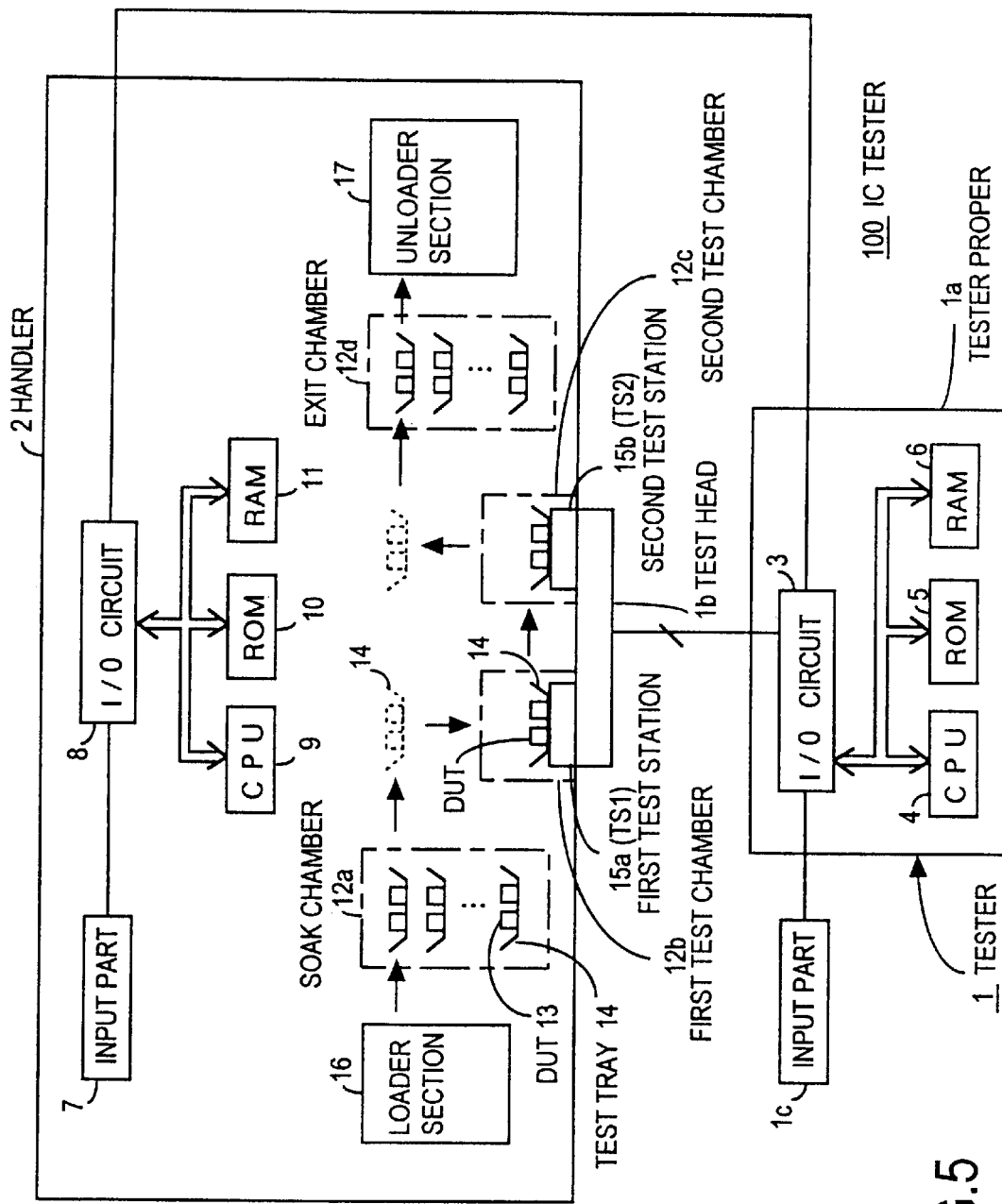
FIG. 5 is a block diagram showing the general construction of an example of the IC tester comprising a handler in which two test stations are provided.
Figure 6:
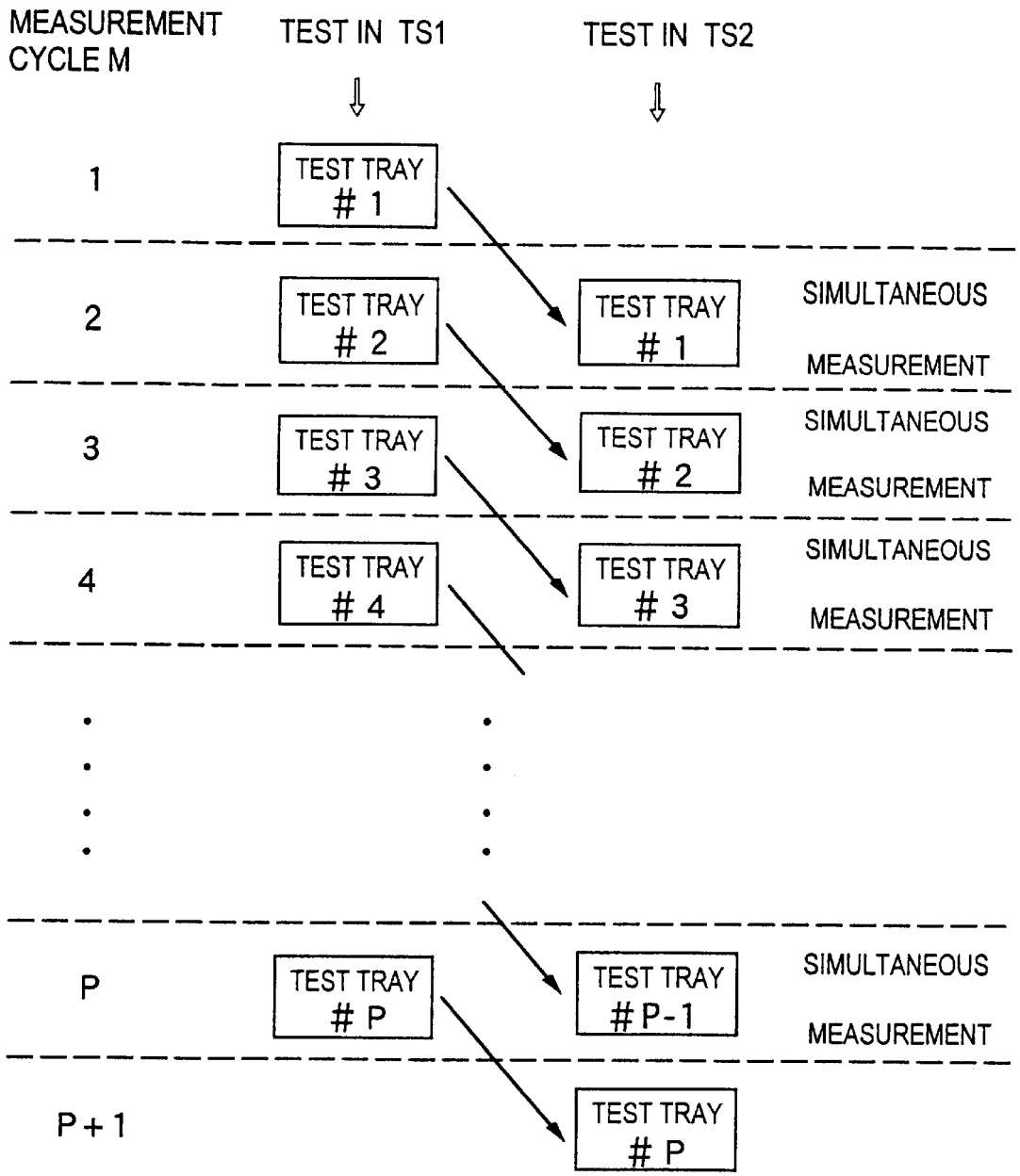
FIG. 6 is a diagram showing the corresponding relationship between each of the measurement cycles in the respective test stations in the IC tester shown in FIG. 5 and test trays.

FIG. 1 is a flow chart for explaining the operation of an IC tester to which the present invention is applied, the IC tester comprising a tester part and a handler connected with the tester part and being arranged such that the handler has two test stations provided therein which are synchronously operated so that ICs to be tested in the two test stations can be tested at the same time as shown in FIG. 5. The construction of this IC tester may be the same as that shown in FIG. 5, and in respect of the IC tester, it will be described with reference to FIG. 5. Further, for clarity of the description, in FIG. 1 the steps corresponding to those in FIG. 7 are shown by the same reference characters affixed thereto and the explanations thereof will be omitted unless necessary.

Figure 7:
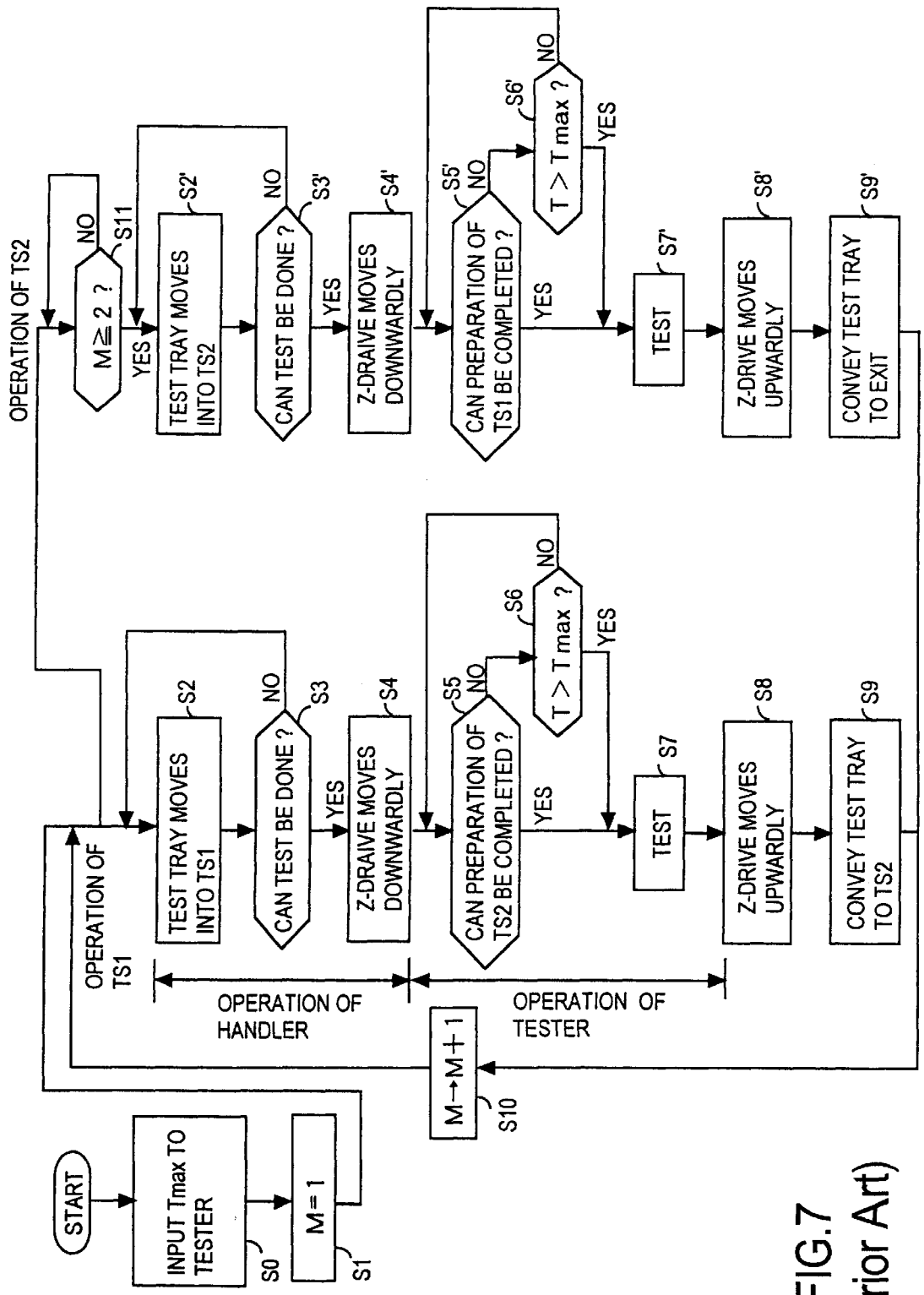
FIG. 7 is a flow chart for explaining the operation of the IC tester shown in FIG. 5.
Figure 8:
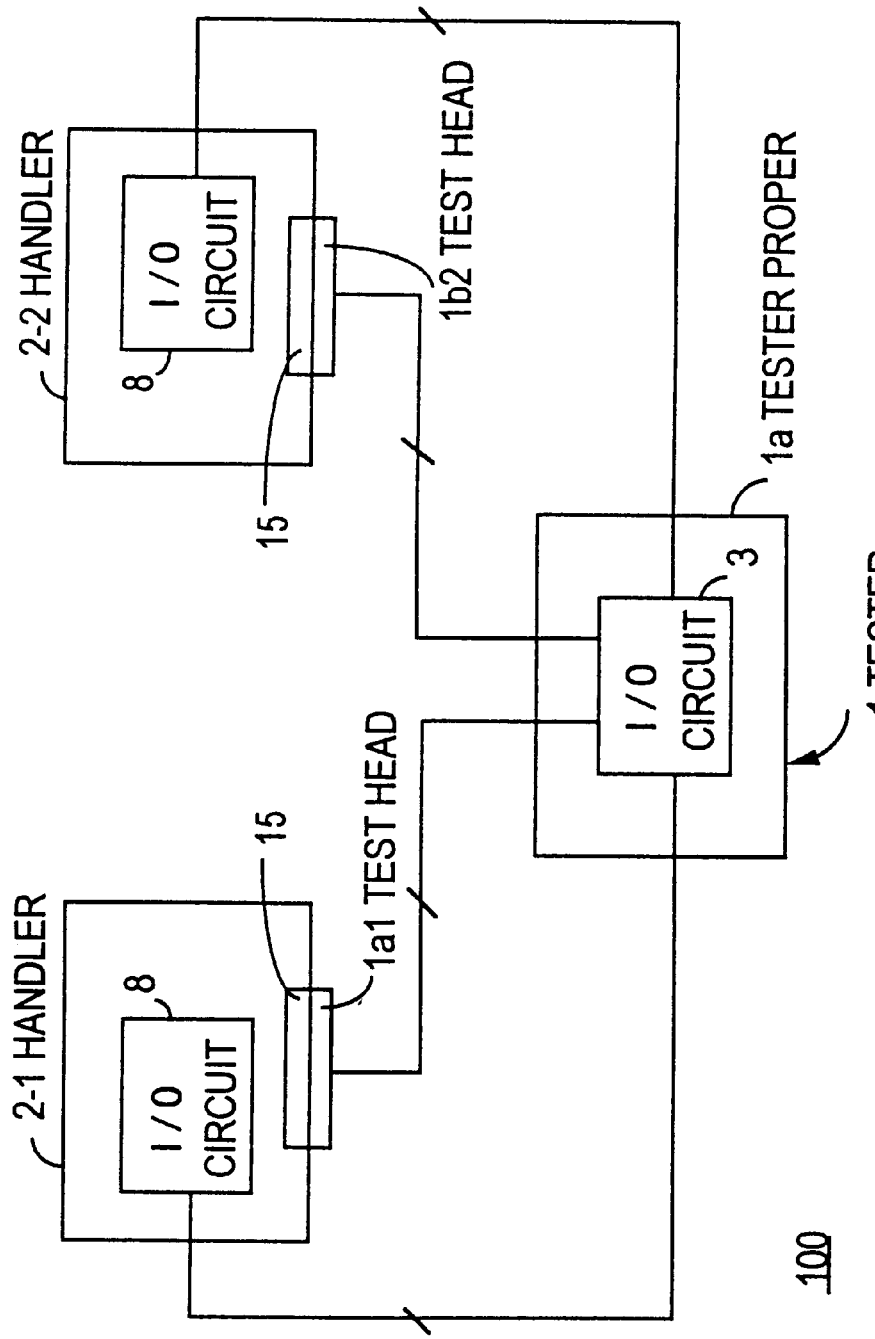
FIG. 8 is a block diagram showing the general construction of an example of the IC tester comprising two handlers.

The differences in the flow chart shown in FIG. 1 from the flow chart shown in FIG. 7 are only in the point that steps S0A, S4A, S4B, S4C, S4D, S8A, S4A', S4B', S4C', S4D', and S8A' are added to the steps shown in FIG. 7.

In the present invention, there is provided an input means for inputting a simultaneous measurement mode into a handler 2, and the IC tester is arranged in this simultaneous measurement mode such that even if the preparation of a test in the first test station 15a among the first and the second two test stations 15a and 15b is completed, the handler 2 transmits to the tester part 1 signals each indicating the preparation of a test is completed (hereinafter referred to simply as test preparation complete signal) of the two test stations 15a, 15b after the handler 2 has waited till the preparation of a test in the second test station 15b is completed except that there is no test tray 14 in the second test station 15b. As a result, the tester part 1 can carry out the simultaneous measurements as soon as it receives the test preparation complete signal from the handler 2 independently of the length in time of the maximum waiting time Tmax for the simultaneous measurements which is previously set in the tester part 1.

Now, the operation of the IC tester 100 to which the present invention is applied will be described mainly as to the added new steps.

Step S0A: the simultaneous measurement mode is inputted into the RAM 11 of the handler 2 and the RAM 6 of the tester proper 1a from the input part 7 of the handler 2. Further, if the simultaneous measurement mode is not inputted, the operation shown in FIG. 7 is effected.

Step S4A: the handler 2 turns a test start flag on when the preparation of a test in the first test station 15a (TS1) is completed (becomes OK) in order to synchronize the first test station 15a with the second test station 15b (TS2).

Step S4B: since the preparation of a test in the first test station 15a has been completed, the handler 2 checks whether the preparation of a test in the second test station 15b is completed or not, and if it is completed (YES), the program proceeds to the next step S4D, and if not (NO), the program proceeds to a branched step S4C.

Step S4C: the handler 2 checks whether a test tray 14 exists in the second test station 15b or not, and if the test tray 14 does not exist (YES), the program proceeds to the next step S4D, and if exits (NO), the program turns back to the previous step S4B. The operations of these steps S4B and S4C represent that the handler 2 waits till the preparation of a test in the second test station 15b is completed except when there is no test tray 14 in the second test station 15b.

Step S4D: since the preparation of a test in the second test station 15b has been completed (except when there is no test tray 14 in the second test station 15b) in addition to the completion of the preparation of a test in the first test station 15a, the handler 2 transmits for the first time the test preparation complete signal of the first test station 15a to the tester part 1.

Step S5: the CPU 4 of the tester part 1 checks whether the preparation of a test in the second test station 15b or not, and if it is completed (YES), the program proceeds to the next step S7, and if not (NO), the program proceeds to a branched step S6. Except when there is no test tray 14 in the second test station 15b, the preparation of a test in the second test station 15b has already been completed, and hence the tester part 1 an perform the simultaneous measurements in the next step S7 at once independently of the length in time of the maximum waiting time Tmax for the simultaneous measurements. If there is no test tray in the second test station 15b, for example, in case that a test tray stops between the first test station 15a and the second test station 15b due to any trouble or the like, the program proceeds to step S6 in which the tester part 1 waits till the preparation of a test in the second test station 15b is completed within the limit of the maximum waiting time Tmax.

Steps S4A' to S7': they are the operations similar to the operations of the steps S4A to S7 in the first test station 15a described above, and hence the explanations thereof will be omitted.

As is easily understood from the foregoing, by applying the present invention to the IC tester which comprises a tester part and a handler connected with the tester part and is arranged such that the handler has two test stations provided therein which are synchronously operated so that ICs to be tested in the two test stations can be tested at the same time, a signal indicating whether the simultaneous measurements can be performed or not is transmitted from the handler to the tester part, and therefore, it is to be appreciated that the tester part can carry out the simultaneous measurements as soon as it receives the test preparation complete signal for the simultaneous measurements from the handler independently of the length in time of the maximum waiting time Tmax for the simultaneous measurements which is previously set in the tester part. Consequently, according to the present invention, there is no useless waiting time, resulting in an advantage that the throughput of the IC tester can be improved.

Figure 2:
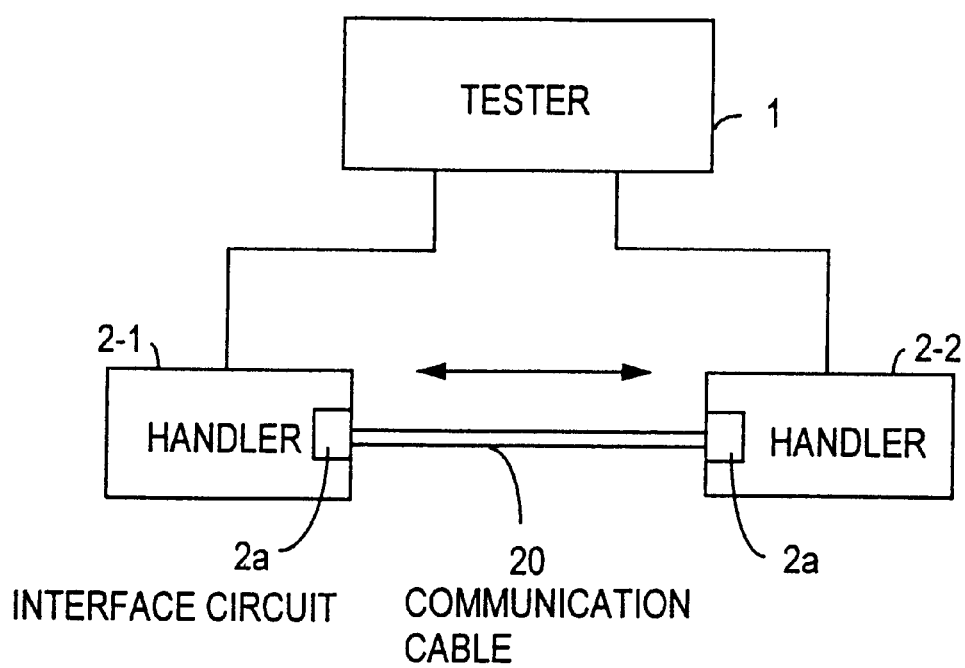
FIG. 2 is a block diagram showing the general construction of the IC tester comprising two handlers to which the present invention is applied.

FIG. 2 shows an example of the IC tester of the type comprising a tester part 1 and two handlers 2-1, 2-2 connected to the tester part 1, to which the present invention is applied. In the present invention, there are provided in the two handlers 2-1 and 2-2 respectively interface circuits 2a by which the handlers 2-1 and 2-2 directly communicate with each other. A communication cable 20 is connected between these interface circuits 2a and the one handler monitors the status of the other handler through the interface circuits 2a. As an interface circuit 2a may be used a parallel interface, GPIB (general purpose interface bus) or the like.

One of the two handlers 2-1, 2-2 is set to a host handler and the other handler is set to a slave handler. In order to synchronize the two handlers with each the other to synchronously operate them, it is necessary that the one is set to the host or master handler and the other is set to the slave handler, thereby to grasp the operating status of the counterpart handler with each other. The host handler and the slave handler are simply set to such names by the communication cable 20 for interconnecting between the interface circuits 2a of the both handlers 2-1 and 2-2. More particularly, the communication cable 20 is manufactured such that the one end thereof is connected to the host side and the other end thereof is connected to the slave side. Therefore, the handler to which the host side end of the communication cable 20 is connected comes to the host handler and the handler to which the slave side end of the communication cable 20 is connected comes to the slave handler. In other words, the same one handler comes to the host handler or the slave handler depending upon which end of the communication cable 20 is connected thereto. The host handler signals a host identification signal and the slave handler signals a slave identification signal.

Figure 3:
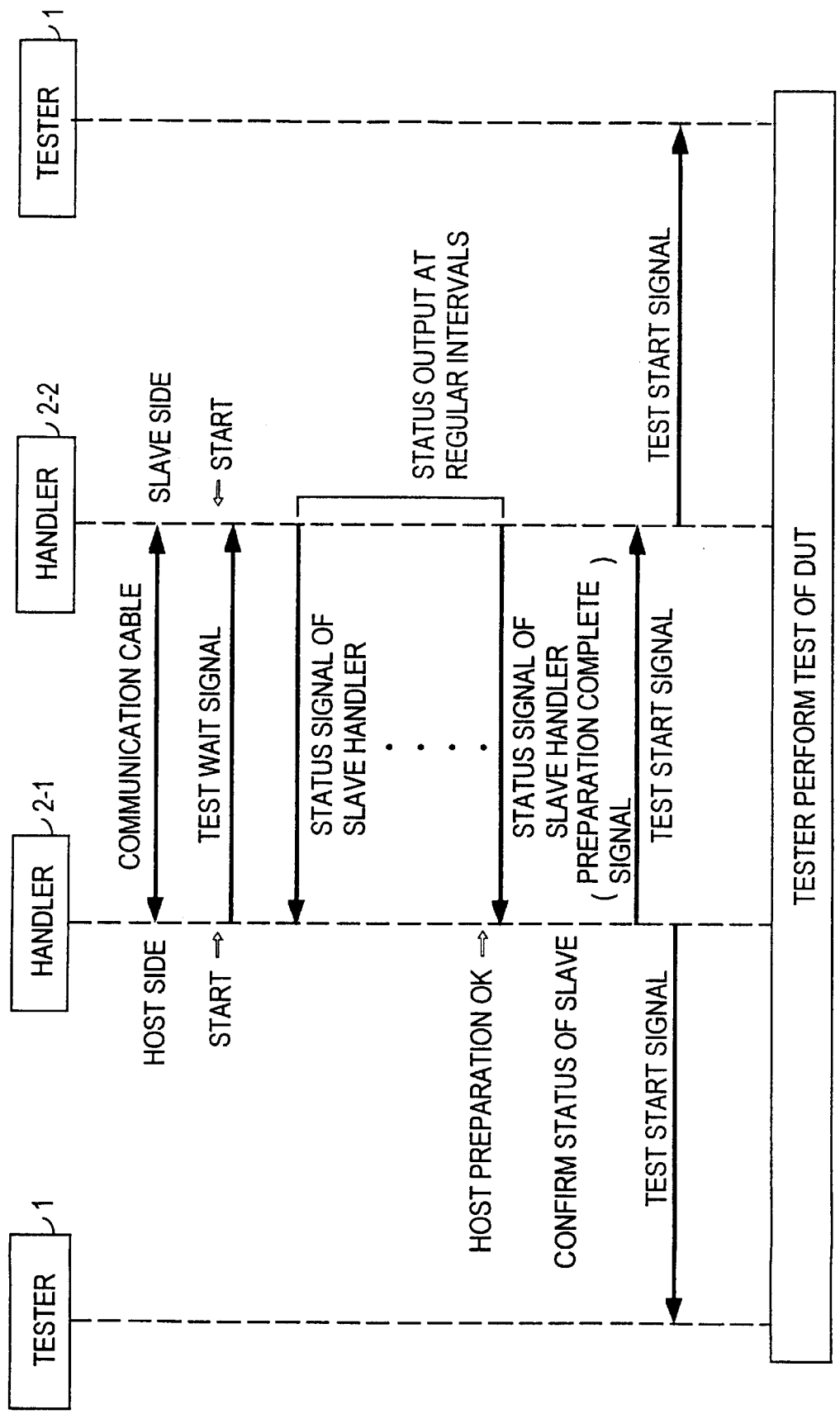
FIG. 3 is a diagram for explaining the operation of the IC tester shown in FIG. 2.

FIG. 3 is a diagram showing signals transmitted and received between the two handlers 2-1 and 2-2 to gasp or know the status of the operation of the counterpart handler with each other. In the illustrated example, as shown in FIG. 3, the one handler 2-1 is set to the host or master handler and the other handler 2-2 is set to the slave handler. The host handler 2-1 transmits a test wait signal and a test start signal to the slave handler 2-2. The slave handler 2-2 transmits its various status signals to the host handler 2-1.

The status signals of the slave handler 2-2 include the following:

(1) A signal for informing occurrence of an alarm (hereinafter referred to simply as alarm occurrence informing signal)

(2) A signal for indicating that the preparation of a test is completed (test OK) (hereinafter referred to simply as test preparation complete signal); among handlers, there are cases that some handler has a plurality of test stations (test positions), and hence the number of the test preparation complete signal increases in correspondence with the number of test stations. In such case, signals such as the preparation of a test in station 1 is completed (station 1 preparation OK), the preparation of a test in station 2 is completed (station 2 preparation OK), and the like are used as the test preparation complete signal.

(3) A handler empty signal; when supply of any IC to the test station of the slave handler 2-2 is ceased, the handler outputs a status signal for indicating that it has no IC, namely, the handler empty signal.

(4) Excepting the aforementioned items (1) to (3), a signal indicating that a test is in preparation (hereinafter referred to simply as test preparation signal) is transmitted.

The transmitting conditions of the test start signal and the test wait signal that the host handler 2-1 transmits are as follows:

(1) The host handler 2-1 transmits the test start signal, when it receives the handler empty signal mentioned above from the slave handler 2-2, to the slave handler 2-2. When the slave handler 2-2 receives this test start signal, it transmits a test start signal (test preparation complete signal) to the tester part 1.

(2) When an alarm occurs in the slave handler 2-2 (when the host handler 2-1 receives an alarm occurrence informing signal from the slave handler 2-2), the host handler 2-1 transmits the test start signal to the slave handler 2-2. As a result, the slave handler transmits a test start signal (test preparation complete signal) to the tester part 1.

(3) When both the slave handler 2-2 and the host handler 2-1 have been ready for a test, the host handler 2-1 transmits a test start signal (test preparation complete signal) to the tester part 1.

(4) Excepting the aforementioned items (1) to (3), the host handler 2-1 transmits the test wait signal to the slave handler 2-2.

Figure 4:
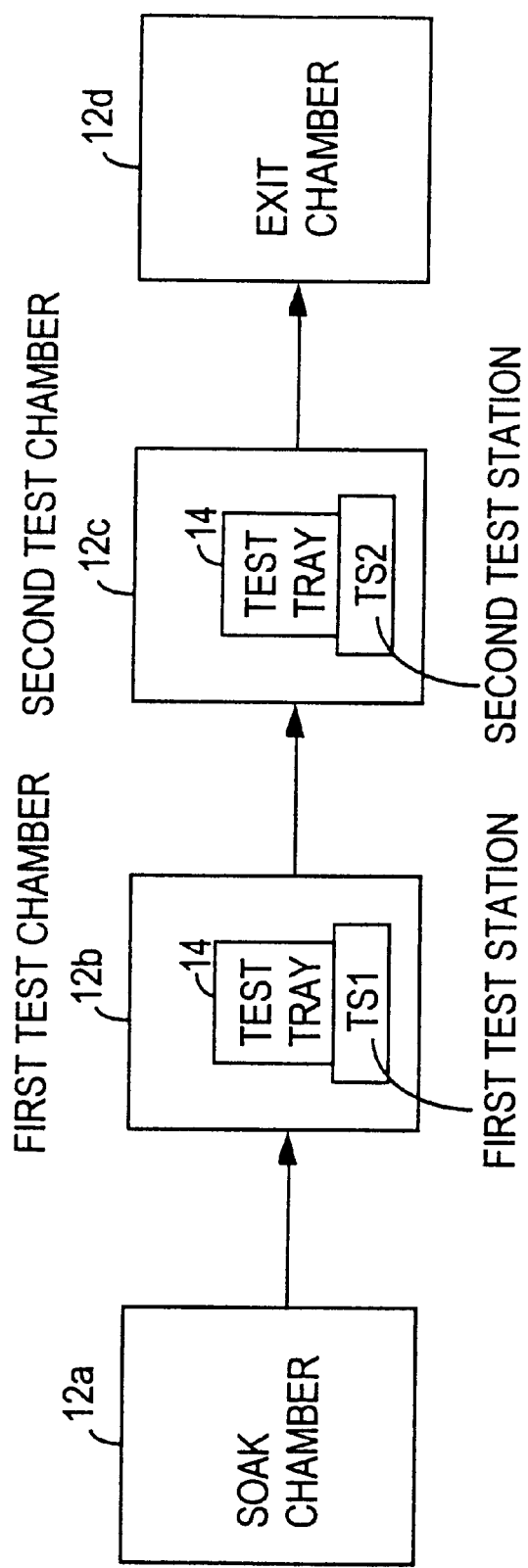
FIG. 4 is a block diagram showing the chamber section of each of the handlers shown in FIG. 2.

As shown in FIG. 4, in case that each of the handlers has a plurality of test chambers (in this example, two test chambers 12b and 12c) provided therein and accordingly, a plurality of test stations are provided (in this example, two test stations TS1 and TS2) in each handler, it is necessary to take a synchronism between the test stations TS1 and TS2 in order to conduct the simultaneous measurements in these test stations at a next opportunity. For this reason, there may be a case that a forced or compulsory test is temporarily carried out in one of the test's stations.

Next, a moving time duration of a test tray will be described. A conveyance sequence of a test tray 14 in each handler is as follows:

(1) A test tray 14 is carried from a constant temperature chamber (soak chamber) 12a to the first test station TS1. This moving time duration of the test tray is referred to as "α".

(2) In the first test station TS1, a test is conducted on ICs under test loaded on the test tray 14.

(3) The test tray 14 is carried from the first test station TS1 to the second test station TS2. This moving time duration of the test tray is referred to as "β".

(4) In the second test station TS2, a test is conducted on ICs under test loaded on the test tray 14.

(5) The test tray 14 is moved from the second test station TS2 to a temperature stress removing chamber (exit chamber) 12d. This moving time duration of the test tray is referred to as "γ".

Further, in the above-mentioned moving time durations of the test tray 14, as is apparent from the construction of the handler 2 already discussed with reference to FIG. 5, the moving time duration "β" of the test tray 14 from the first test station TS1 to the second test station TS2 is extremely shorter than the moving time durations "α" and "γ".

Next, some moving patterns of a test tray in the two handlers 2-1 and 2-2 will be described.

A first moving pattern of a test tray is a pattern that when a test tray is at the first test station TS1 in the first handler 2-1 and a test tray is at the second test station TS2 in the second handler 2-2, ICs under test loaded on both the test trays are simultaneously measured or tested.

After the simultaneous measurements have been conducted, the test tray in the first handier 2-1 is moved from TS1 to TS2 (the moving time is "β"), whereas in the second handler 2-2, the test tray is moved from TS2 to the temperature stress removing chamber 12d (the moving time is "γ"). As a result, the moving times of both the test trays are represented by "γ" in the second handler 2-2

Subsequently, in the first handier 2-1, an another test tray is moved from the constant temperature chamber 12a to TS1 (the moving time is "α"), whereas in the second handler 2-2, an another test tray is moved from TS1 to TS2 (the moving time is "β"). Consequently, the moving times of both the test trays are represented by "α" in the first handler 2-1. The same manner is to be repeated in the following.

A second moving pattern of a test tray is a pattern that when a test tray is at the first test station TS1 in the first handler 2-1 and a test tray is also at the first test station TS1 in the second handler 2-2, ICs under test loaded on both the test trays are simultaneously measured or tested.

After the simultaneous measurements have been effected, the test tray in the first handler 2-1 is moved from TS1 to TS2 (the moving time is "β"), and also, in the second handler 2-2, the test tray is moved from TS1 to TS2 (the moving time is "β"). As a result, the moving times of both the test trays are represented by "β".

Subsequently, in the first handler 2-1, an another test tray is moved from the constant temperature chamber 12a to TS1 (the moving time is "α"), and also, in the second handler 2-2, an another test tray is moved from the constant temperature chamber 12a to TS1 (the moving time is "α"). Consequently, the moving times of both the test trays are represented by "α". The same manner is to be repeated in the following.

As can be understood from the first and the second patterns, depending upon which test station is used for the simultaneous measurements, an index time of each handler is greatly influenced. Therefore, in case of performing the simultaneous measurements in two handlers, it is an important essence or factor which test station is used.

There is a case that the simultaneous measurements need not be conducted by force depending upon a test time. For this end, it is necessary to set to two handlers as to whether each handler uses the function of the above perfect simultaneous measurements or not, respectively.

In case of setting a mode in which the simultaneous measurements are not effected, each handler outputs a test request signal to the tester part as soon as it is ready for a test. The tester part waits, when it receives a test request signal only from one of the handlers, a test request signal to be sent from the other handler within the limit of the maximum waiting time Tmax set thereto. If a test request signal should not be sent from the other handler after the maximum waiting time Tmax has passed, the tester part starts the one handler measuring.

In case of setting a mode in which the simultaneous measurements are effected, as shown in FIG. 3, the handler 2-1 in the host side confirms the status of the handler 2-2 in the slave side to take a synchronism between them, and then it transmits a test request signal (test start signal) to the tester part 1. The tester part 1 receives a test request signal at substantially the same time, and hence there is no wait time for the simultaneous measurements at all.

In case of setting the mode in which the simultaneous measurements are effected, the following two modes can be further selected.

(1) A mode in which the simultaneous measurements are not effected if an alarm occurs When an alarm occurs in the host handler 2-1, the host handler 2-1 outputs a test start signal to the slave handler 2-2. The slave handler 2-2 outputs a test start signal (test preparation complete signal) to the tester part 1 as soon as the slave handler is ready for a test. The tester part 1 starts to conduct a test without waiting any time duration for the simultaneous measurements since it has received an alarm signal from the host handler 2-1.

When an alarm occurs in the slave handler 2-2, the slave handler 2-2 transmits a status signal (alarm) of the handler to the host handler 2-1. The host handler 2-1 outputs a test start signal (test preparation complete signal) to the tester part 1 as soon as the host handler is ready for a test. The tester part 1 starts to conduct a test without waiting any time duration for the simultaneous measurements since it has received an alarm signal from the slave handler 2-2.

(2) A mode in which the simultaneous measurements are effected even if an alarm occurs When an alarm occurs in the host handler 2-1, the host handler 2-1 outputs a test wait signal to the slave handler 2-2. The slave handler 2-2 cannot carry out any test until it receives a test start signal from the host handler 2-1.

When an alarm occurs in the slave handler 2-2, the slave handler 2-2 transmits a status signal (alarm) of the handler to the host handler 2-1. The host handler 2-1 does not output any test start signal to the slave handler 2-2 until it receives a test preparation complete signal from the slave handler 2-2.

In such cases, however, there may occur a case that the host handler waits a test preparation complete signal from the slave handler without any limitation on time. Therefore, it is arranged that the hot handler waits within the limit of the maximum waiting time HTmax (for example, 300 seconds) set thereto, and when this maximum waiting time HTmax of the handler time has passed, a test can be conducted by only one handler. That is, when an alarm occurs in the host handler, the host handler transmits a test start signal to the slave handler after the maximum waiting time HTmax of the handler has elapsed, and the slave handler transfers the test start signal to the tester part when it receives that signal. When an alarm occurs in the slave handler, the host handler transmits a test start signal to the tester part after the maximum waiting time HTmax has elapsed.

As is clear from the foregoing discussion, in the present invention, in case that two test stations are provided in one handler, an input means for inputting a simultaneous measurement mode into the handler is provided in the handler, and the handler waits, in case that the preparation of a test in one test station is completed and the preparation of a test in the other test station is not completed, till the preparation of a test in the other test station is completed except when there is no test tray in the other test station, and when the preparation of a test in the other test station is completed, the handler transmits test preparation complete signals of the two test stations to the tester part. As a result, the tester part can conduct the simultaneous measurements without waiting any time duration for the simultaneous measurements. In such a way, the simultaneous measurements can be effected regardless of the magnitude of the maximum waiting time Tmax for the simultaneous measurements, which results in an remarkable advantage that the throughput of an IC tester can be increased.

In addition, in case that two handlers are connected to one tester part, one of the two handlers is set to a host handler and the other handler is set to a slave handler, and a data communication path or channel by which both the handlers directly communicate with each other is provided between the host and the slave handlers such that the host handler always monitors the status of the slave handler. In case of the simultaneous measurement mode, the host handler waits, if the preparation of a test in the host handler is completed and the preparation of a test in the slave handler is not completed, until the preparation of a test in the slave handler is ready, and when the preparation of a test in the slave handler has been completed, the host handler transmits a test preparation complete signal to the tester part. Accordingly, the test preparation complete signals are transmitted from both the handlers substantially at the same time. Therefore, the tester part can conduct the simultaneous measurements without waiting any time duration for the simultaneous measurements and regardless of the magnitude of the maximum waiting time Tmax for the simultaneous measurements, which results in an remarkable advantage that the throughput of an IC tester can be increased.

Moreover, even in case of the simultaneous measurement mode, a mode in which the simultaneous measurements are not effected can be selected if an alarm occurs in one handler. Accordingly, when an alarm occurs in one handler, this handler can transmit an alarm occurrence informing signal to the tester part and the other handler can transmit a test preparation complete signal (test start signal) to the tester part as soon as the other handler has been ready for the test. As a result, the tester part can conduct the measurement only in the other handler without waiting any time duration for the simultaneous measurements, resulting in an advantage that a meaningless waiting time is avoided.

While the present invention has been described in the foregoing description taking by example the case in which the present invention is applied to the IC testing apparatus for testing ICs typical of semiconductor devices, it is needless to say that the present invention is also applicable to testing apparatus for testing semiconductor devices other than ICs with equal functional effects.

What is claimed is:

1. A semiconductor device testing apparatus comprising one tester part and one handler, wherein said handler has a first test station provided therein which conducts a primary measurement on semiconductor devices under test and a second test station provided therein which conducts a secondary measurement on semiconductor devices under test, and wherein said tester part waits, in case that the preparation of a test in the one test station is completed, till the preparation of a test in the other test station is completed within the limit of a maximum waiting time (Tmax), and if the preparation of a test in the other test station is completed within the maximum waiting time, performs the simultaneous measurements in both the test stations, and if not completed, performs the measurement only in the one test station, said semiconductor device testing apparatus being arranged such that in case that the preparation of a test in the first test station is completed and the preparation of a test in the second test station is not completed, the measurement is started only in the first test station without waiting for the completion of the preparation of a test in the second test station if there is no test tray in the second test station, and when there is a test tray in the second test station, the handler waits till the preparation of a test in the second test station is completed within the limit of the maximum waiting time (Tmax), and in case that the preparation of a test in the second test station is completed within the maximum waiting time, the simultaneous measurements are carried out in the first and the second test stations at the same time, and in case that the preparation of a test in the second test station is not completed, the measurement is started only in the first test station; and that in case that the preparation of a test in the second test station is completed and the preparation of a test in the first test station is not completed, the measurement is started only in the second test station without waiting for the completion of the preparation of a test in the first test station if there is no test tray in a loader section or the first test station, and when there is a test tray in the loader section or the first test station, the handler waits till the preparation of a test in the first test station is completed within the limit of the maximum waiting time (Tmax), and in case that the preparation of a test in the first test station is completed within the maximum waiting time, the measurements are carried out in the first and the second test stations at the same time, and in case that the preparation of a test in the first test station is not completed, the measurement is started only in the second test station.

2. The semiconductor device testing apparatus according to claim 1, wherein an input means for inputting a simultaneous measurement mode into the handler is provided in the handler; and wherein when the simultaneous measurement mode is inputted into the handler from the input means, the handler waits, in case that the preparation of a test in the first test station is completed and the preparation of a test in the second test station is not completed, till the preparation of a test in the second test station is completed if there is a test tray in the second test station, and when the preparation of a test in the second test station is completed, the handler transmits the test preparation complete signals of the first and the second test stations to the tester part, and if there is no test tray in the second test station, the handler transmits only the test preparation complete signal of the first test station to the tester part without waiting till the preparation of a test in the second test station is completed, and wherein the handler waits, in case that the preparation of a test in the second test station is completed and the preparation of a test in the first test station is not completed, till the preparation of a test in the first test station is completed if there is a test tray in the loader section or the first test station, and when the preparation of a test in the first test station is completed, the handler transmits the test preparation complete signals of the first and the second test stations to the tester part, and if there is no test tray in the loader section or the first test station, the handler transmits only the test preparation complete signal of the second test station to the tester part without waiting till the preparation of a test in the first test station is completed.

3. A semiconductor device testing apparatus comprising one tester part and two handlers, wherein said tester part waits, in case that the preparation of a test in the one handler is completed, till the preparation of a test in the other handler is completed within the limit of a maximum waiting time (Tmax), and if the preparation of a test in the other handler is completed within the maximum waiting time, performs the simultaneous measurements in both the handlers, and if not completed, performs the measurement only in the one handler, said semiconductor device testing apparatus being arranged such that in case that the preparation of a test in the one handler is completed and the preparation of a test in the other handler is not completed, the measurement is started only in the one handler without waiting for the completion of the preparation of a test in the other handler if there is no test tray in a loader section or a test station of the other handler, and when there is a test tray in the loader section or the test station of the other handler, the one handler waits till the preparation of a test in the other handler is completed within the limit of the maximum waiting time (Tmax), and in case that the preparation of a test in the other handler is completed within the maximum waiting time, the measurements are carried out in both the handlers at the same time, and in case that the preparation of a test in the other handler is not completed, the measurement is started only in the one handler.

4. A semiconductor device testing apparatus comprising one tester part and two handlers, wherein said tester part waits, in case that the preparation of a test in the one handler is completed, till the preparation of a test in the other handler is completed within the limit of a maximum waiting time (Tmax), and if the preparation of a test in the other handler is completed within the maximum waiting time, performs the simultaneous measurements in both the handlers, and if not completed, performs the measurement only in the one handler, said semiconductor device testing apparatus being characterized in that:
interface circuits by which the two handlers directly communicate with each other are provided in the handlers respectively, the interface circuits being connected with each other by communication cable means;
one of the two handlers is set to a host handler and the other handler is set to a slave handler;
an input means is provided for inputting a simultaneous measurement mode into at least one of the host handler and the tester part; and
the host handler monitors, when the simultaneous measurement mode is inputted, the status of the slave handler through the interface circuits, and in case that the preparation of a test in the host handler is completed and the preparation of a test in the slave handler is not completed, test preparation complete signals (test start signals) are transmitted to the tester part from both the handlers substantially at the same time after the host handler waits till the preparation of a test in the slave handler is completed.

5. The semiconductor device testing apparatus according to claim 4, wherein the upper limit time duration (HTmax) is provided for the time duration that the host handler waits till the preparation of a test in the slave handler is completed, and when the upper limit time duration has passed, the host handler transmits its test preparation complete signal to the tester part.

6. The semiconductor device testing apparatus according to claim 4, wherein a mode which prevents the simultaneous measurements from being performed when an alarm occurs in one of the handlers is provided in the simultaneous measurement mode, and in case this mode is selected, when an alarm occurs in the one handler, the other handler transmits its test preparation complete signal to the tester part on completion of the preparation of a test in the other handler, and the tester part performs the measurement only in the other handler without waiting till the preparation of a test in the one handler is completed.

7. The semiconductor device testing apparatus according to claim 4, wherein the slave handler transmits a signal representing its status of operation to the host handler at regular intervals.

8. The semiconductor device testing apparatus according to claim 7, wherein the signal representing the status of operation of the slave handler includes an alarm occurrence informing signal, a test preparation complete signal, a handler empty signal indicating that a semiconductor device under test is not supplied to a test station, and a signal under test preparation.

* * * * *